United States Patent [19]
Smith et al.

[11] Patent Number: 6,140,910
[45] Date of Patent: *Oct. 31, 2000

[54] STABILIZED POLYSILICON RESISTOR AND A METHOD OF MANUFACTURING IT

[75] Inventors: Ulf Smith, Huddinge; Matts Rydberg, Uppsala, both of Sweden

[73] Assignee: Telefonaktiebolaget LM Ericsson, Stockholm, Sweden

[*] Notice: This patent issued on a continued prosecution application filed under 37 CFR 1.53(d), and is subject to the twenty year patent term provisions of 35 U.S.C. 154(a)(2).

[21] Appl. No.: 08/877,059

[22] Filed: Jun. 17, 1997

[30] Foreign Application Priority Data

Jun. 17, 1996 [SE] Sweden .................................. 9602395

[51] Int. Cl.$^7$ .................................................. H01C 1/012

[52] U.S. Cl. ............................................ 338/309; 338/308

[58] Field of Search ................................... 338/307, 308, 338/309; 438/383, 385

[56] References Cited

U.S. PATENT DOCUMENTS

| | | | |
|---|---|---|---|
| 4,740,478 | 4/1988 | Zdebel et al. | 437/33 |
| 5,196,723 | 3/1993 | Andersson et al. | 257/489 |
| 5,212,108 | 5/1993 | Liu et al. | 437/60 |

FOREIGN PATENT DOCUMENTS

WO97/10606  3/1997  WIPO .

OTHER PUBLICATIONS

Japanese Abstract 5–55470, Mar. 5, 1993.

T. Kamins, *Polycrystalline Silicon for Integrated Circuit Applications*, Kluwer Academic Publishers, pp. i–viii, 155–202, 212–215, 281–290, (1988) No Month.

S. Maegawa et al., "Performance and Reliability Improvements in Poly–Si TFT's by Fluorine Implantation into Gate Poly–Si" IEEE Transactions on Electron Devices, vol. 42, No. 6, pp. 1106–1112 (Jun. 1995).

A. Yoshida et al., "Hydrogen, fluorine ion implantation effects on polycrystalline silicon grain boundaries" Solar Energy Materials and Solar Cells, vol. 34, pp. 211–217 (1994) No Month.

*Primary Examiner*—Michael Gellner
*Assistant Examiner*—Kyung S. Lee
*Attorney, Agent, or Firm*—Burns, Doane, Swecker & Mathis, L.L.P.

[57] ABSTRACT

A resistor has a resistor body of polycrystalline silicon and electric terminals arranged on and/or in the resistor body. A resistor portion is thus formed between the terminals, which gives the resistor its resistance. The material in the resistor body is doped with for example boron. In order to block unsaturated silicon bonds in grain boundaries to a sufficient extent and thereby give the resistor a good long-time stability, fluorine atoms are added to the material. They are added in such a high concentration that all of the otherwise unsaturated bonds are coupled to fluorine atoms. Further, it is provided in the manufacture of the resistor that the concentration is maintained at the originally high value. When ion implanting dopants and fluorine atoms it can be accomplished by performing an annealing after implanting dopants at a high temperature and then a further annealing operation at a low temperature after the subsequent implantation of fluorine.

2 Claims, 9 Drawing Sheets

STABILIZED POLYSILICON RESISTOR AND A METHOD OF MANUFACTURING IT

TECHNICAL FIELD

The invention relates generally to electronic components, primarily electronic component which are used in electronic integrated circuits or are produced by means of the processing methods used for producing electronic integrated circuits, and in particular to electric resistors made of polycrystalline silicon and a method of manufacturing such resistors.

BACKGROUND OF THE INVENTION AND STATE OF THE ART

Resistors of polycrystalline silicon, also called polysilicon, have been used within the electronic field during more than thirty years. Methods of manufacturing polycrystalline silicon are known as well as methods of manufacturing resistors from polycrystalline silicon. It is also known how the resistivity of the polysilicon material can be controlled to obtain a desired value by adding dopants to the material. The general technique is illustrated in the book "Polycrystalline Silicon for Integrated Circuit Applications" by T. Kamins, ISBN 0-89838-259-9, Kluver Academic Publishers, 1988.

In analogue electronic circuits the requirements of stability of resistors included in the circuits are extremely high: the specifications in regard of the maximum allowed change of the absolute value of the resistance must be fulfilled for a resistor in such a circuit all the time when the circuit is used and the resistance changes of resistors which are matched to each other must be such that the ratio of the resistances to each other is maintained all the time when the circuit is used. These requirements thus comprise that the resistors must be sufficiently stabile during all the time when the circuit is used.

In applications where polysilicon resistors are used in critical parts of electronic circuits the insufficient stability of such resistors is a known practical problem. The fact is that the resistors can change their resistance values in an unpredictable way during the use thereof. Such deviations from the value determined by the designer as well as deviations of the resistance values of matched resistors can jeopardize the operation of the electronic circuit in which such resistors are included. The cause of the instability is to be searched in the unsaturated bonds which exist in the grain boundaries of the polysilicon material. The unsaturated bonds are formed in the boundaries between the individual monocrystalline grains in the polycrystalline silicon material owing to the fact that the periodic order of the silicon atoms in their crystal lattice inside the grains does not exist at the boundaries. The outermost silicon atoms in a crystalline grain therefore have not sufficiently many silicon atoms as their closest neighbours in order to form the four bonds which are characteristic of the lattice of silicon crystals. The resulting unsaturated bonds at the grain boundaries act as traps of charge carriers and bind thereby electrical charges to the grain boundaries, influencing the capability of the material of transporting charge carriers and thereby the resistivity of the material.

If the number of bound charges would remain constant from the instance when the manufacture of the resistors was finished and during all time when the resistor was used there would not exist any problems relating to the stability of the resistors. However, the number of traps can decrease if individual atoms can migrate out of the grains, into the grain boundaries and there be attached to the unsaturated bonds and thereby prevent that the latter ones can continue to work as traps of the charge carriers. In the similar way the number of traps can increase in the case where atoms leave their positions at the grain boundary and thereby leaves an unsaturated bond behind.

It is known that the unsaturated bonds can be blocked by adding hydrogen atoms to the grain boundaries. Hydrogen can exist in a rich amount in layers deposited on an integrated circuit containing a polysilicon resistor, e.g. in passivating layers of silicon dioxide or silicon nitride, such as typically 20–25% in the passivating films of silicon nitride which are produced by plasma CVD and which conventionally are used as a protection for finished integrated circuits and components.

The hydrogen atoms react with the unsaturated bonds and block them so that they cannot continue to operate as traps. However, a problem related to hydrogen atoms which have been bound to unsaturated bonds, is that the binding strength between hydrogen and silicon is low compared to e.g. the bond of silicon to silicon. The bonds can therefore easily be broken and then the hydrogen atoms diffuse away from their positions at the grain boundaries and the unsaturated bonds are again exposed. Since unsaturated bonds captures charge carriers, it will result in that the resistance value is changed. The causes of the fact that the bonds are broken are not completely known, but they can be related to a general increase of temperature or to local temperature variations caused by increased power generation in critical points of the resistor. However, it cannot be excluded that the bonds can also be broken owing to purely kinetic effects caused by running charge carriers.

Even if the capability of the hydrogen atoms of blocking unsaturated bonds is what is primarily discussed in literature, it cannot be excluded, that other atoms which happen to be placed in a grain boundary or leave it produce similar effects, if they cannot bind sufficiently strongly to the silicon atoms at the grain boundary. Without indicating here the magnitude of the influence, it can be mentioned that it also is possible that dopant atoms which during the use of the resistor interact with the grain boundaries in a dynamic way, can have the same influence on the resistivity as the hydrogen atoms. In the same way it cannot be excluded that also other atom kinds included in the resistor and unintentionally added impurities can have the same influence.

A stabilized resistor built on polysilicon is disclosed in the published International patent application WO 97/10606. The material of the resistor body is doped with both acceptors and donors. In order to block charge carrier traps in grain boundaries to a sufficient degree and thereby confer a good stability to the resistor, when it is exposed to different substances in the sequence of technical processing steps in the manufacturing procedure, and also a good long-time stability, the doping with donor atoms is made in such a high concentration that if only the donor atoms would be present in the material and substantially no acceptor atoms, the material would be considered as more or less hard doped. It means rather high concentrations of doping atoms and as has been indicated above these atoms can to some extent move into and out through the grain boundaries. It is due to the fact that the segregating mechanism which causes dopant atoms to be placed in ground boundaries in the heat treatments or annealing operations, is active also at lower temperatures, though to a much smaller extent. Such resistors stabilized by means of compensation doping could therefore be less stabile.

A compensation doping requires the addition of at least two dopants, i.e. of at least one donor and at least one acceptor, in accurately balanced, high concentrations and there can be difficulties to achieve this in the processing.

A more efficient and stabile blocking of unsaturated bonds than what can achieved by means of hydrogen atoms can be produced by adding atoms of some other suitable kind which form a sufficiently strong bond to the silicon atoms in the silicon grain boundaries. Thus, in U.S. Pat. No. 5,212,108 for Lieu et al. a method of producing polysilicon resistors is disclosed where the resistors are intended to be used in memory cells. In a polysilicon film arsenic ions are implanted in order to define the resistivity of the material. An implantation made thereafter of fluorine ions stabilizes the grain boundaries. Thereby, the variations of the barrier height of the charge carriers between different batches of produced circuit chips are reduced. After implanting fluorine an annealing at 900° C. can be performed.

However, polysilicon resistors manufactured in this way generally appear to have an insufficient long-time stability.

The influence of hydrogen and fluorine on the grain boundaries in polysilicon films has been studied in conjunction with electric characteristics of thin film transistors and solar cells, see e.g. S. Maegawa, T. Ipposhi, S. Maeda, H. Nishimura, T. Ichiki, M. Ashida, O. Tanina, Y. Inoue, T. Nishimura and N. Tsubouchi, "Performance and Reliability Improvements in Poly-Si TFTs by Fluorine Implantation into Gate Poly-Si", IEEE Trans. Electron Devices, Vol. 42, pp. 1106–1112 (1995) and A. Yoshida, M. Kitagawa, F. Tojo, N. Egashira, K. Nakagawa, T. Izumi and T. Hirao, "Hydrogen, fluorine ion implantation effects on polycrystalline silicon grain boundaries", Solar Energy Materials and Solar Cells, Vol. 34, pp. 211–217 (1994).

SUMMARY

It is an object of the invention to provide polysilicon resistors having a good long-time stability which in a safe way can be used particularly in delicate electronic circuits such as circuits of the analogue type, intended for example for measurements or as circuits associated with sensors, where resistance values of resistors for example included in amplifier circuits directly affect an output signal indicating a measured value.

The solution of the problem exposed above relating to the stability of polysilicon resistors which in many cases is insufficient or at least is unreliable or unpredictable, is, as has been already been indicated, that it should be achieved that the unsaturated bonds in the grain boundaries of the polysilicon material are blocked and that further the blocking operation is accomplished in such a way that, considering the conditions existing when using the circuit, can be considered to be substantially permanent. Such a blocking operation can be accomplished by ensuring that a least number of the unsaturated bonds are blocked by atoms of a suitable kind and that atoms of this kind bind sufficiently strongly to the silicon atoms in the grain boundaries of the polysilicon material. The added atoms should be compatible to and not interfere with the remaining manufacturing steps required to produce the electronic circuit. As has been indicated above, fluorine binds more strongly to silicon than hydrogen does, and fluorine is therefore the preferred kind of atom for achieving a blocking operation of the unsaturated bonds. It must also be ensured that a least a sufficient amount of fluorine atoms are provided to the grain boundaries during the manufacture of the resistors and that the fluorine atoms incorporated in this least amount actually remain, or at least that a sufficient share or proportion of the incorporated fluorine atoms remains, at their positions at the grain boundaries during the subsequent manufacturing steps up to a finished electronic circuit.

Thus, the concentration of the added fluorine atoms must exceed some minimum level in order to allow that an optimal stabilization of the resistors is achieved. This minimum level should exceed the concentration level of fluorine atoms which sometimes are added to polysilicon films doped with boron in the case where the implantation of boron in the film is made by means of boron difluoride ions. However, only marginal effects are obtained, if the heat treatment or the annealing after the implantation of fluorine is made at the high temperatures which are normally used in e.g. steps for driving-in or for diffusing, such as for activating added, e.g. implanted, atoms in the manufacture of the circuits. These high temperatures are considered to be necessary in order to heal damages to the crystal lattice which have been produced in implanting operations. However, they result in that the bond of fluorine to silicon is broken and that the fluorine atoms diffuse out of the material.

However, surprisingly good results are obtained in the case where the annealing temperature after implanting fluorine is tuned so that it is not too low to permit a sufficient healing of the damages and not so high that the fluorine atoms are given a possibility to leave the grain boundaries. This is most easily achieved if the annealing after implanting fluorine is made in a separate step and thus is not combined with for example the annealing operations which are required in order to heal damages to the crystal lattice developed in processing steps which are made before implanting fluorine, and in order to activate dopants relating to preceding implantations of required acceptor and donor atoms.

Such a processing comprising an addition of fluorine atoms to the material in order to obtain stabilized resistors can be preferred to the compensation doping method discussed above, since it only requires that as a minimum a single donor or acceptor is added to the material in an accurately controlled concentration in order to obtain a desired resistance of the resistors and thereupon an addition of fluorine which does not have to be controlled too accurately, as long as a sufficient amount of fluorine atoms remains within the polysilicon material. The step of adding fluorine can in certain cases also be more easy to add to a process flow which is required for producing a more or less complicated circuit in which the resistor is included.

Generally thus, in the conventional way a resistor comprises a resistor body of polycrystalline silicon, which can exist as a thin plate having a rectangular, e.g. elongated shape. Electrical terminals are placed on and/or in the resistor body so that a resistor portion is obtained between the terminals which determines the resistance of the resistor. The material of the resistor portion is doped with dopants, acceptors and/or donors, so that the resistor obtains the desired resistance. This material also contains blocking atoms, fluorine atoms. In order to obtain a sufficient stability the material should have a healed structure, which is obtained by a suitable annealing operation in the case where the addition of dopant and fluorine atoms is made by means of ion implantation. However, in other methods of adding atoms to polysilicon no such special annealing may be required. The fluorine atoms in the material should in any case exist in such a high concentration that a large number, a maximum number, of the otherwise unsaturated bonds at grain boundaries in the polycrystalline silicon are blocked, whereby the resistance of the resistor portion will be substantially constant in time, when the resistor is used in an electric circuit. It can also be told in the way that substantially all of the otherwise unsaturated bonds from silicon atoms in the polysilicon are blocked by or coupled to fluorine atoms.

In many cases these conditions will be fulfilled, if the concentration of fluorine atoms in the material is at least as high as or equal to the concentration which should be obtained in the material having the corresponding resistivity, which had been doped using only boron difluoride ions and no other kinds of donors or acceptors. In many practical cases the conditions are also fulfilled in the case where the concentration of the fluorine atoms is at least $2 \cdot 10^{19}$ cm$^{-3}$.

In the manufacture of such a resistor first a body is produced, such as a thin film or a thin layer having a suitable exterior profile, made of polycrystalline silicon. The material of the body is doped, when manufacturing the body and/or thereafter in a particular step, with one or more dopants, so that the resistor is given the desired resistance. In some way the material of the body is also provided with fluorine atoms and further electric terminals are arranged for the body, so that a complete resistor element is obtained. The fluorine atoms must then be added in a high concentration, a sufficiently high concentration according to the discussion above. After the addition of fluorine atoms the material is to be exposed only to temperatures which are so low that no significant diffusion of fluorine atoms out of the body is produced and that the concentration of fluorine atoms in the material thereby is maintained at substantially the same high value which was obtained when actually adding the fluorine atoms. These temperatures should be maximally 800° and in particular lower than 750° C.

In the case where the doping with a dopant is made by means of ion implantation and where the fluorine atoms thereafter are added also by means of ion implantation, an annealing is performed for achieving the healing operation mentioned above, at a first temperature after the implanting of dopant and before implanting fluorine atoms. A separate annealing operation is then performed at a second temperature after implanting fluorine atoms and the second temperature should be significantly lower than the first one, in order not to produce any significant diffusion of fluorine atoms away from the resistor body. The second temperature can according to the discussion above be maximally or lower than 800° C., in particular maximally or lower than 750° C. In order to produce a sufficient healing of implantation damages it should in many cases be minimally or higher than 650° C.

DESCRIPTION OF THE DRAWINGS

The invention will now be described in detail by way of non-limiting embodiments with reference to the accompanying drawings, in which.

DETAILED DESCRIPTION

Figure 1:
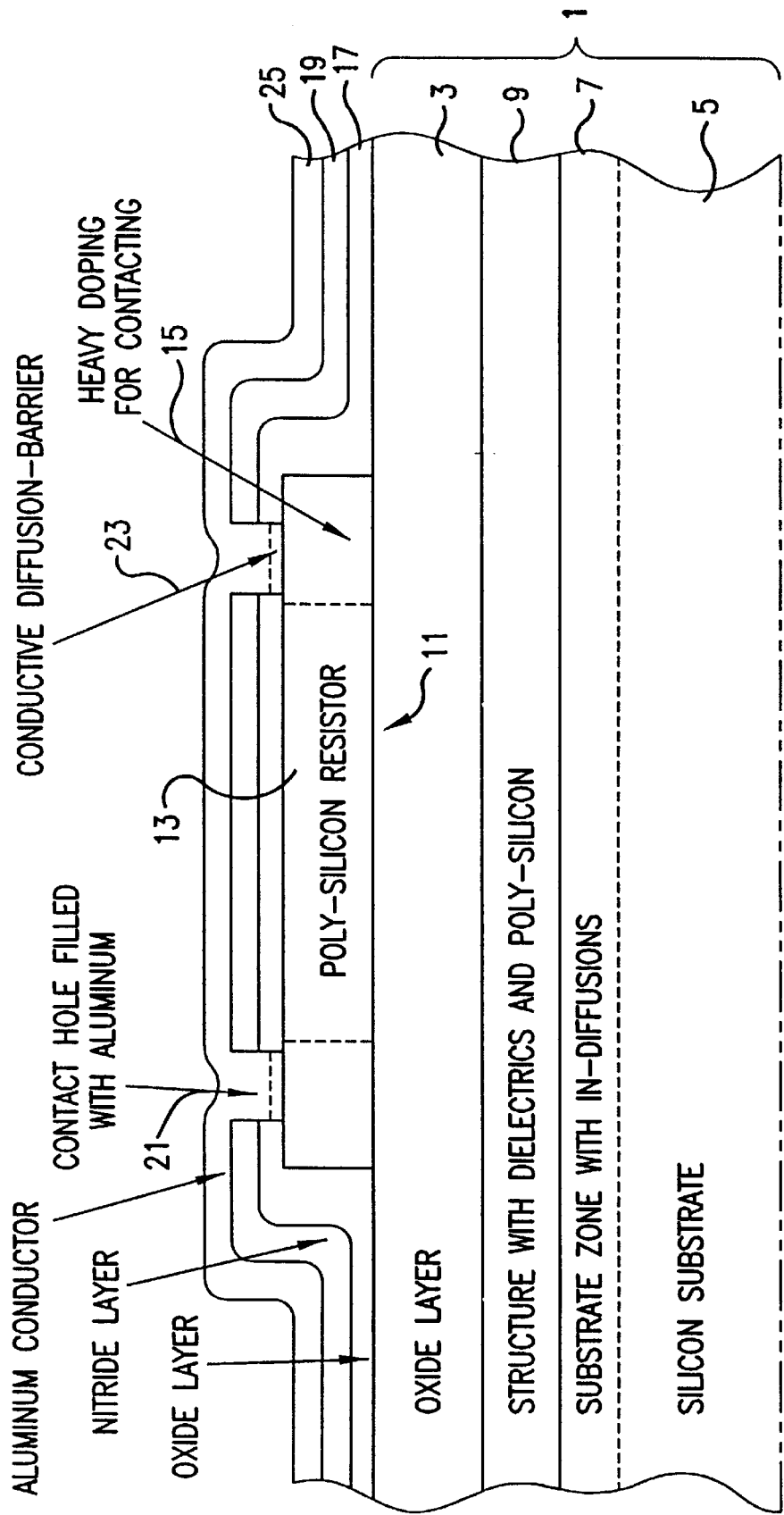
FIG. 1 is a schematic picture of a cross section of a resistor produced of polycrystalline silicon, where possible top layers comprising e.g. other integrated components and passivating layers are omitted.

In FIG. 1 an example is shown of a cross section through a polysilicon resistor. It has been formed on a support structure 1, which can contain integrated components and at its top has an isolating layer 3 of silicon oxide, which for example is oxide produced by thermal growing but which naturally also can be deposited oxide. In the embodiment illustrated, at the bottom of the support structure 1 a silicon substrate 5, e.g. a monocrystalline silicon chip, is provided, on top of the substrate 5 a silicon substrate zone 7 having different regions where various substances are diffused into the material, on top of the substrate zone a layer structure 9 comprising dielectric materials and polysilicon and at the very top of the structure the oxide layer 3. On the oxide layer 3 the very platform or "mesa" 11 is located which is the resistor body and which as viewed from above has for example a rectangular shape, see also the views from above of the very resistor body in FIG. 2. The resistor body 11 comprises an interior or intermediate portion 13, which is the portion which gives or determines the resistance of the resistor, and exterior areas 15 for electrical contacting, which can be very highly doped and thereby have a rather little electrical resistance.

The upper surface of the agglomerate of the support structure 1 and the resistor body 11 is covered by a silicon oxide layer 17 and thereupon a silicon nitride layer 19, but it is also possible to arrange on top of the agglomerate further layers comprising passive or active electrical and electronic devices. A passivating layer, not shown, consisting of either silicon nitride or silicon dioxide respectively or both together can in any case be arranged at the top. Holes 21 are made through the oxide layer 17 and the silicon nitride layer 19 down to the upper surface of the contacting areas 15. At the surface of the contacting areas 15 inside the hole 21 regions 23 are provided for further improving the electrical contact with electrical conductor paths 25 of aluminium for the electric connection of the resistor. The regions 23 can comprise electrically conducting, diffusion barrier layers including e.g. titanium or some titanium compound diffused into the material from an applied layer.

The manufacture of polysilicon resistors in a conventional way will now be described with reference to a detailed example, see the U.S. patent document mentioned above. The resistance of the resistors is determined by doping with boron.

Example 1

Polycrystalline silicon films having a thickness of 5500 Å were deposited according to the known CVD method (Chemical Vapour Deposition) on thermal silicon dioxide having a thickness of 9000Å. On top of the polysilicon film silicon dioxide of a thickness of about 5500Å was deposited by means of CVD. Thereupon an annealing was performed at 1050° C. during 30 minutes in order to among other things define the grain size of the polysilicon. The polysilicon surface was etched to be clean of oxide, whereupon boron was implanted to a concentration in the film of $9.4 \cdot 10^{18}$ cm$^{-3}$ at an energy of 80 keV. Thereupon a litho-graphically defined mask was applied to the polysilicon and the resistors were produced by etching. Thereafter, silicon dioxide of a thickness of 6500Å was deposited at 400° C. by means of CVD, followed by an anneal at 1000° C. during about 45 minutes. It was followed by a processing flow normal to the technical field of manufacturing integrated circuits 35 comprising etching contacting holes, metallization, lithographic definition of conductor paths, alloying in hydrogen at 420° C. during 20 minutes and passivation with a silicon nitride layer having a thickness of 9000Å. The nitride was produced by means of plasma activated CVD (PECVD). The polycrystalline film in the resistors had a resistivity of 605 ohms/rectangular body.

The resistors were mounted in hermetic ceramic capsules and were thereupon subjected to accelerated tests at 98° C. and at 150° C. during a period of 1000 hours, both without and with an applied voltage of 30 V, the resistances being measured at ambient temperature after 0, 168, 500 and 1000 hours. The result is shown as the relative resistance curve for X=0 in the diagrams of FIG. 3 and FIGS. 8–10. As appears from the figures, the resistance of the resistors can increase by up to 2% compared to the resistance value at the start of the test. A change of this order of magnitude exceeds the maximum change allowed for analogue resistors in critical applications. The example illustrates thereby the problem described above, that polycrystalline silicon which has been doped only with boron does not give sufficiently stabile resistors.

As has been discussed above, the cause of the changes of the resistance is to be searched in relation to the unsaturated bonds which exist in the grain boundaries of the polycrystalline material. In order to reduce these changes the unsaturated bonds in the grain boundaries must be blocked in a more or less permanent way such as by arranging that the unsaturated bonds are blocked to a sufficiently high degree by atoms of a suitable kind such as fluorine atoms, which bind sufficiently strongly to the silicon atoms in the grain boundaries and in any case more strongly than hydrogen atoms do.

Figure 2:
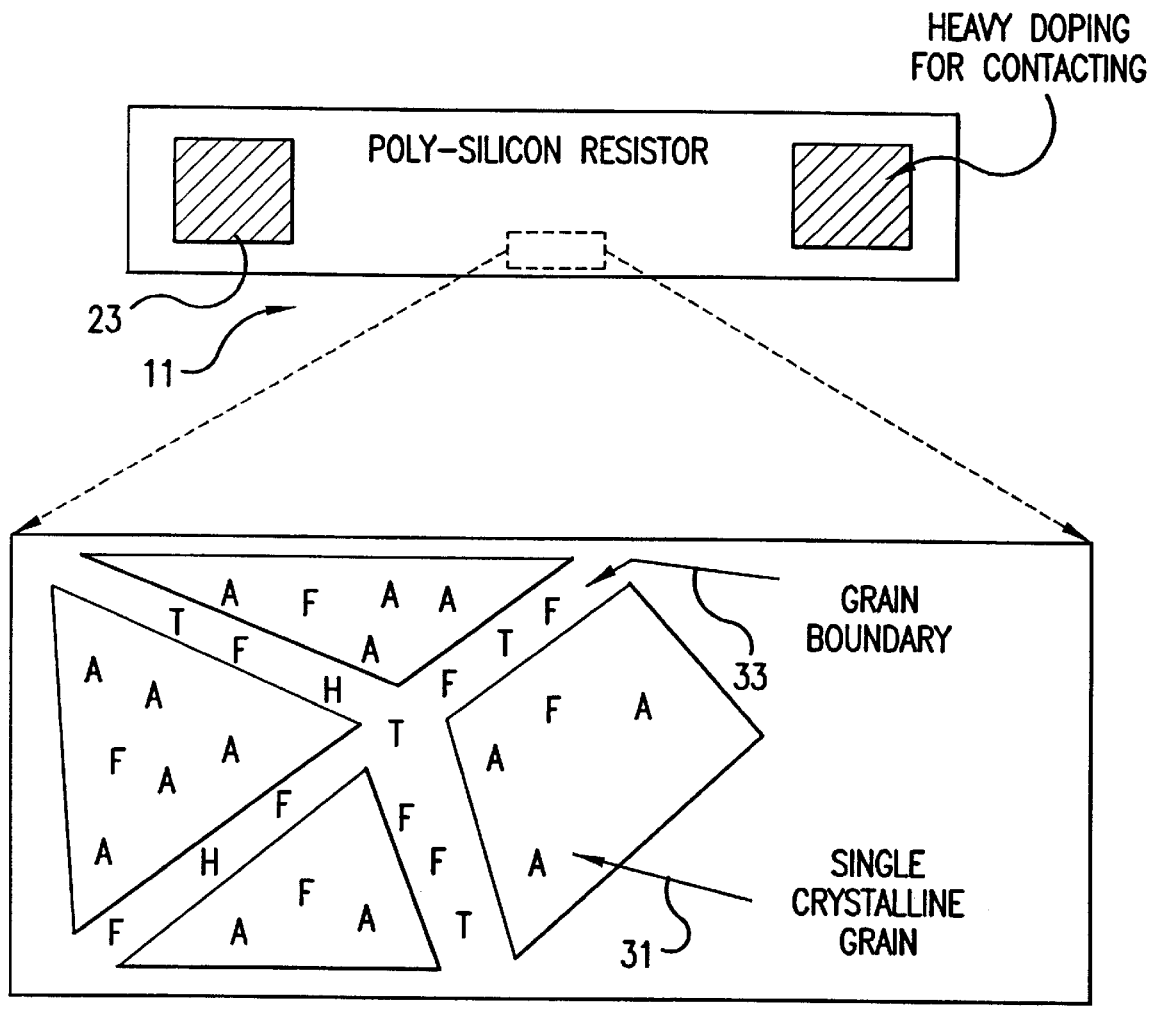
FIG. 2 is a view of a resistor as seen from above where a portion of an area doped with fluorine is strongly enlarged.
Figure 3:
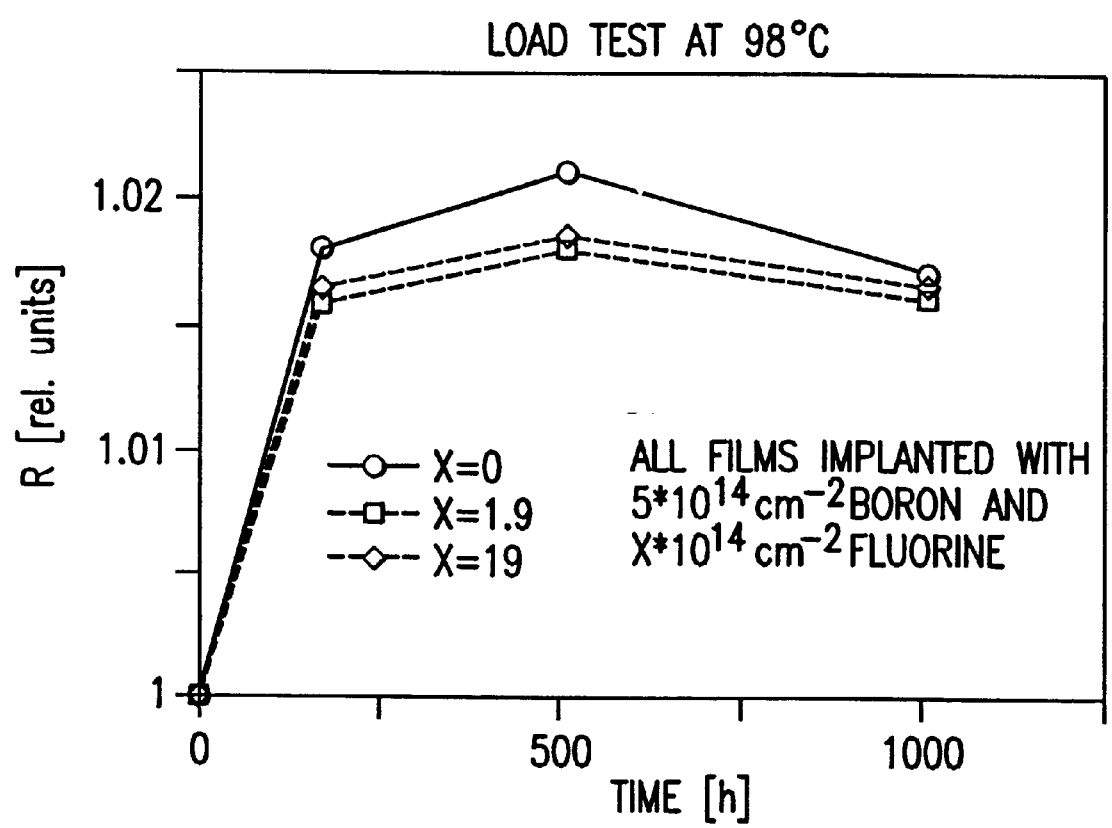
FIG. 3 is a graph showing the relative resistance during long time testing at 98° C. of resistors which have been produced of polycrystalline silicon with boron doping and without and with an addition of fluorine and with a single annealing operation.

Thus, in FIG. 2 is illustrated in a strongly enlarged partial view a very schematic picture of a small area of a polysilicon resistor, to which fluorine atoms have been added. Therefrom appears how acceptor atoms A, fluorine atoms F, charge carrier traps T and possible hydrogen atoms H distribute themselves inside grains 31 and in grain boundaries 33 respectively. Fluorine atoms and hydrogen atoms will thus be located preferably in the grain boundaries.

Now, a detailed example relating to a polysilicon resistor is given, in which fluorine atoms have been added.

Example 2

On polycrystalline silicon films, produced according to example 1, boron was implanted to a concentration in the film of $9.4 \cdot 10^{18}$ cm$^{-3}$ at 80 keV and after that, for a first set of films, fluorine to a concentration of $1.9 \cdot 10^{19}$ cm$^{-3}$, and for a second set of films to a concentration of $1.9 \cdot 10^{20}$ cm$^{-3}$ at 120 keV. After the implantations the films were processed in the same way as in example 1. The annealing at 1000° C. thus was made to affect both the implantations of boron and fluorine. From the obtained polysilicon film resistors were produced according to example 1. The polycrystalline film in the resistors was of p-type and had a resistivity of 610 and 565 ohms/rectangular resistor body respectively.

The resistors were mounted in ceramic capsules and were thereupon subjected to accelerated stress tests at 98° C. and 150° C. during a period of 1000 hours, the resistances being measured at ambient temperature after 0, 168, 500 and 1000 hours. The result for 98° C. is shown by the two lower curves in FIG. 3. This figure is a graph illustrating the relative resistance at accelerated stress tests at 98° C. for an electric voltage of 30 V over 200 $\mu$m long and 20 $\mu$m wide resistors which have been produced of polycrystalline silicon according to example 1 (upper curve) and example 2 (lower curves). From FIG. 3 it appears that the resistance of the resistors doped with fluorine increased substantially as much as the resistance of the resistors not doped with fluorine, with only a small reduction of the change of the resistance. The fact is to be related to the high annealing temperature, 1000° C., and the curves illustrate the importance of the manner in which the annealing is made. In order that an increased stability is to be obtained, the fluorine atoms must remain at their positions in the grain boundaries and they must not to any substantial extent be displaced during the manufacturing steps which follow their addition to the material. The high temperature used in the examples above and also normally used in processing steps after implantation, is generally considered to be necessary in order to heal damages to the crystal lattice which arise in ion implantation. However, a too high temperature results in that the bond between fluorine and silicon is broken and that the fluorine atoms diffuses out of and away from the material.

The annealing temperatures after the addition of fluorine must thus be adapted so that they are not too low in order to accomplish a sufficient healing of possible damages produced in an implanting operation, but not so high that the fluorine atoms can leave the grain boundaries. A method of achieving it is that the annealing after implanting fluorine is made in a separate step at a low temperature and thus is not combined with e.g. the preceding annealing steps which are required in order to heal damages to the crystal lattice which have arisen when adding dopants in order to obtain the intended resistance values and in order to activate the dopants.

An example of this method of manufacture comprising lower processing temperatures after the addition of fluorine is described in detail hereinafter.

Example 3

On polycrystalline crystal films, produced according to example 1, boron was implanted to a concentration in the film of $9.4 \cdot 10^{18}$ cm$^{-3}$ at 80 kev. On top of the polysilicon films silicon dioxide of a thickness of about 5500 Å was deposited by CVD. The films were then annealed at 1000° C. during 30 minutes. The polysilicon surface was etched to be free of oxide, whereupon fluorine was implanted to concentrations in the films in the interval of $(0–9.4) \cdot 10^{19}$ cm$^{-3}$ at the energy of 120 keV. Thereafter a lithographically defined mask was applied to the polysilicon and resistors were etched. After this silicon dioxide having a thickness of 6500 Å was deposited at 400° C. by means of CVD, followed by an annealing at 700° C. during 30 minutes. It was followed by a process flow normal to the technical field comprising etching contact holes, metallization, lithographic definition of the conductor paths, alloying in hydrogen gas at 420° C. during 20 minutes and a passivation with a silicon nitride layer having a thickness of 9000 Å. The nitride was produced by means of plasma activated CVD. The polycrystalline film in the resistors had a resistivity of 650–700 ohms/rectangular resistor body.

Figure 8:
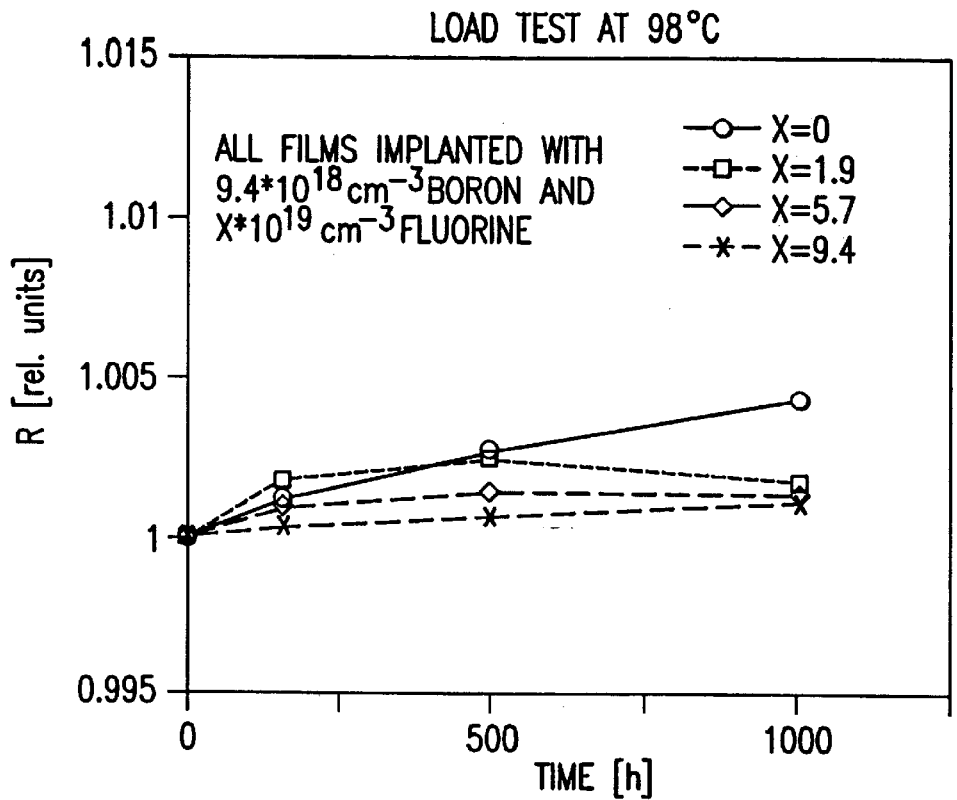
FIG. 8 is a graph showing the relative resistance during long-time testing at 98° C. of resistors which have been produced of polycrystalline silicon with boron doping and without and with an addition of fluorine, where the resistors having an addition of fluorine have been subjected to two annealing operations, one at 1000° C. during 30 minutes directly after implanting boron and one at 700° C. during 30 minutes directly after implanting fluorine.
Figure 9:
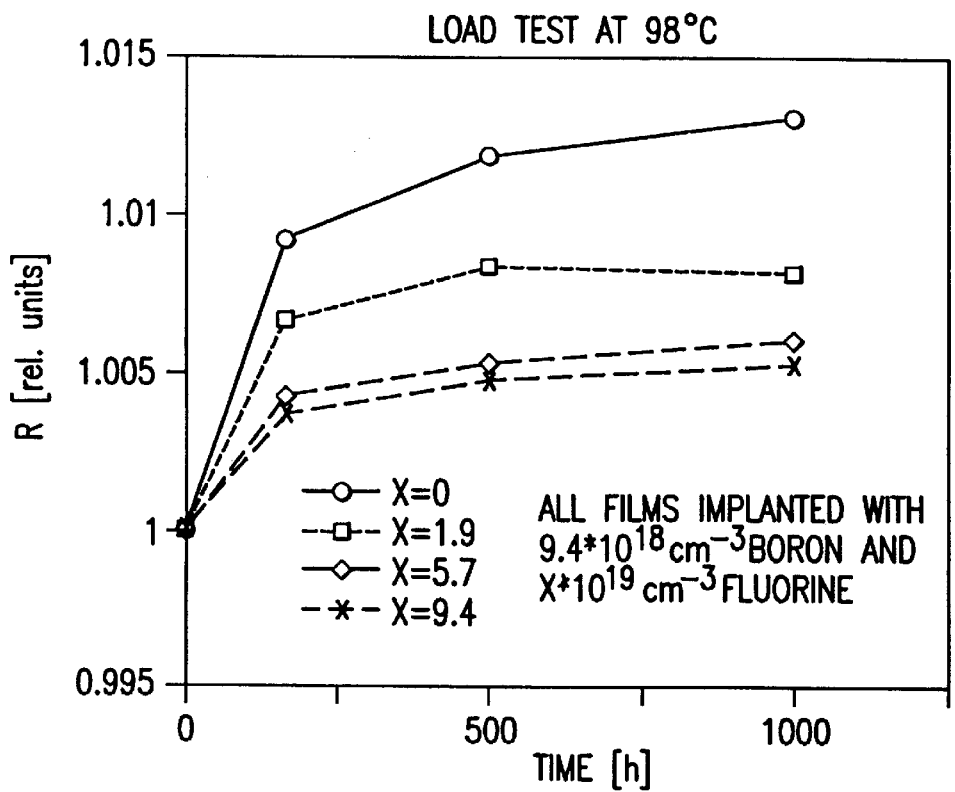
FIG. 9 is a graph showing the relative resistance during long-time testing at 98° C. of resistors subjected to an electric voltage, which have been produced of polycrystalline silicon if with boron doping and without and with an addition of fluorine, where the resistors having an addition of fluorine have been subjected to two annealing operations, one at 1000° C. during 30 minutes directly after implanting boron and one at 700° C. during 30 minutes directly after implanting fluorine.
Figure 10:
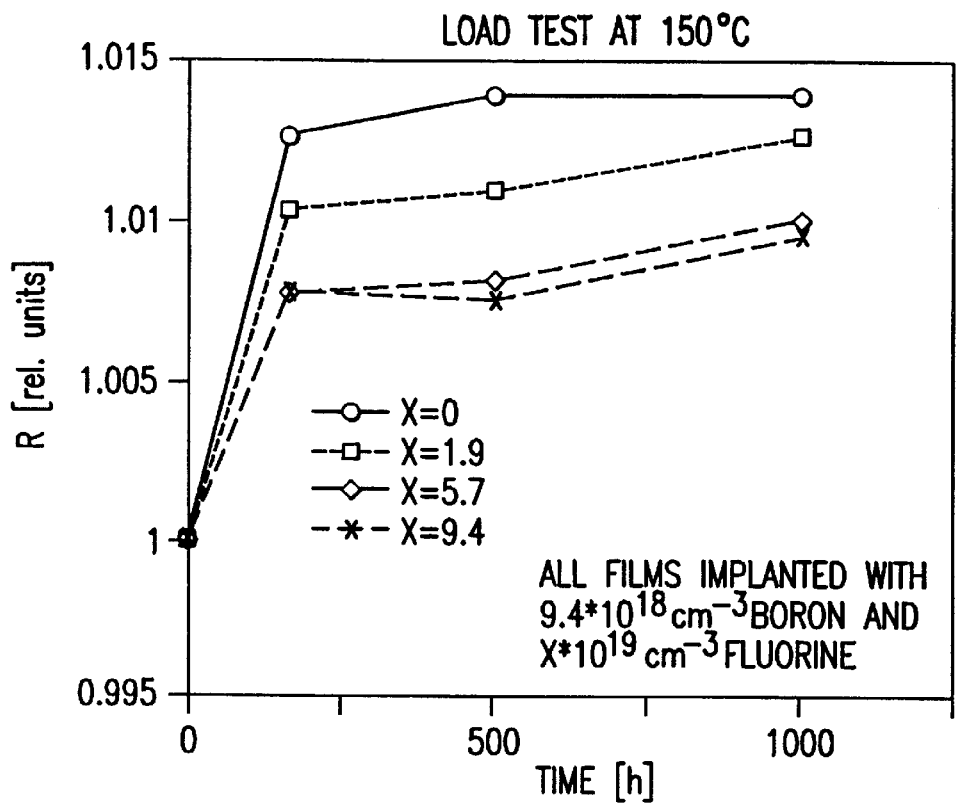
FIG. 10 is a graph showing the relative resistance during long-time testing at 150° C. of resistors which have been produced of polycrystalline silicon with boron doping and without and with an addition of fluorine, where the resistors having an addition of fluorine have been 25 subjected to two annealing operations, one at 1000° C. during 30 minutes directly after implanting boron and one at 700° C. during 30 minutes directly after implanting fluorine.
Figure 11:
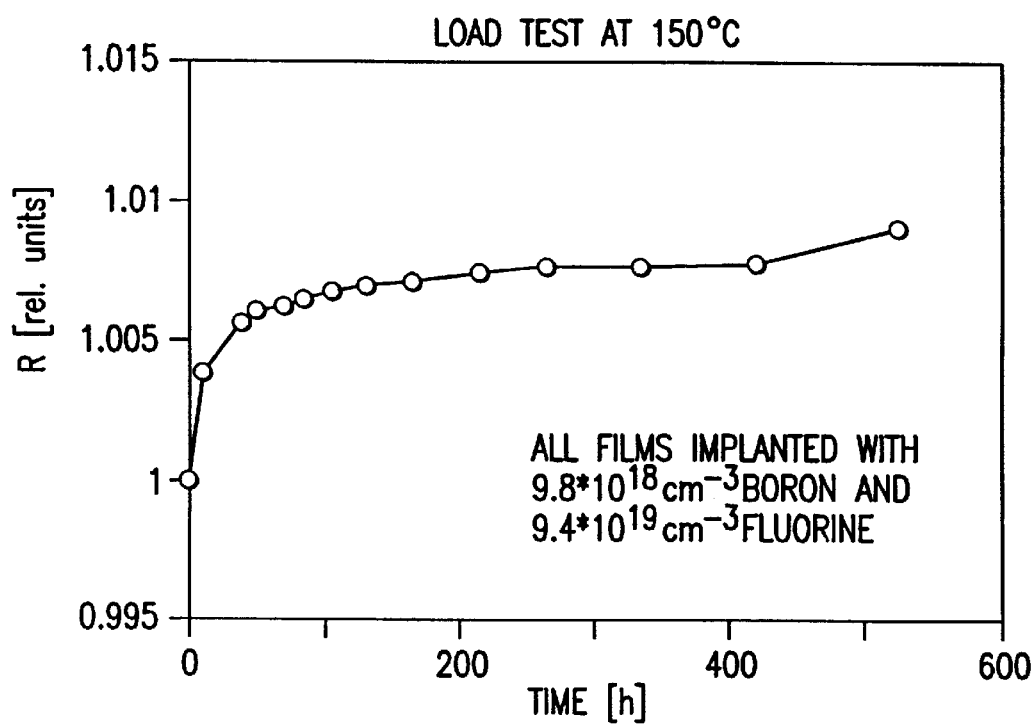
FIG. 11 is a graph showing the relative resistance during long-time testing at 150° C. of a resistor, which is subjected to an electrical voltage, and which is produced of polycrystalline silicon with boron doping and with an addition of fluorine and has been subjected to two annealing operations, one at 1000° C. during 30 minutes directly after implanting boron and one at 700° C. during 30 minutes directly after implanting fluorine.

The resistors were mounted in ceramic capsules and were thereupon subjected to aging tests and accelerated stress tests at 98 and 150° C. during a time period of 1000 hours, the resistances being measured at ambient temperature after 0, 168, 500 and 1000 hours. The resistance values appear from the graphs in FIGS. 8–11, in which the curve drawn in a solid line shows the resistance of a sample having no added fluorine, i.e. produced according to example 1. The resistors were as above 200 μm long and 20 μm wide. The values in FIGS. 8 and 10 are obtained without any electric biasing of the resistors and at 98 and 150° C. respectively, whereas the values in FIGS. 9 and 11 are obtained at 98 and 150° C. respectively but for an electric voltage of 30 V applied over the resistors. As appears from the curves in FIGS. 8–11, the resistance of the resistors doped with fluorine which had a concentration of fluorine which was twice as large as the concentration of boron, increased by approximately half the resistance change of those resistors which had not been doped with fluorine. When the concentration of fluorine was increased to more than five times the concentration of boron, a further strong improvement was obtained. It illustrates the stabilizing effect which is obtained in the case where the resistors are produced according to the described method.

Since hydrogen for example is included in the passivating films of silicon nitride which are produced by means of plasma CVD, it is also important that the produced films do not change their resistivity value when they are directly exposed to a hydrogen atmosphere. A number of films, which had been produced according to the different examples above, were therefore subjected to a hydrogen atmosphere consisting of 10 volume percent of hydrogen gas mixed with 90 percent nitrogen gas for an accelerated hydrogen test at 420° C. during 20 minutes. The electrical resistance was determined before and after the treatment with hydrogen gas and the measured change of the resistance in relation to the resistance value at the beginning of the test was calculated. The reversibility of the hydrogen bonding was verified by a subsequent treatment in pure nitrogen gas at 510° C.

Figure 7:
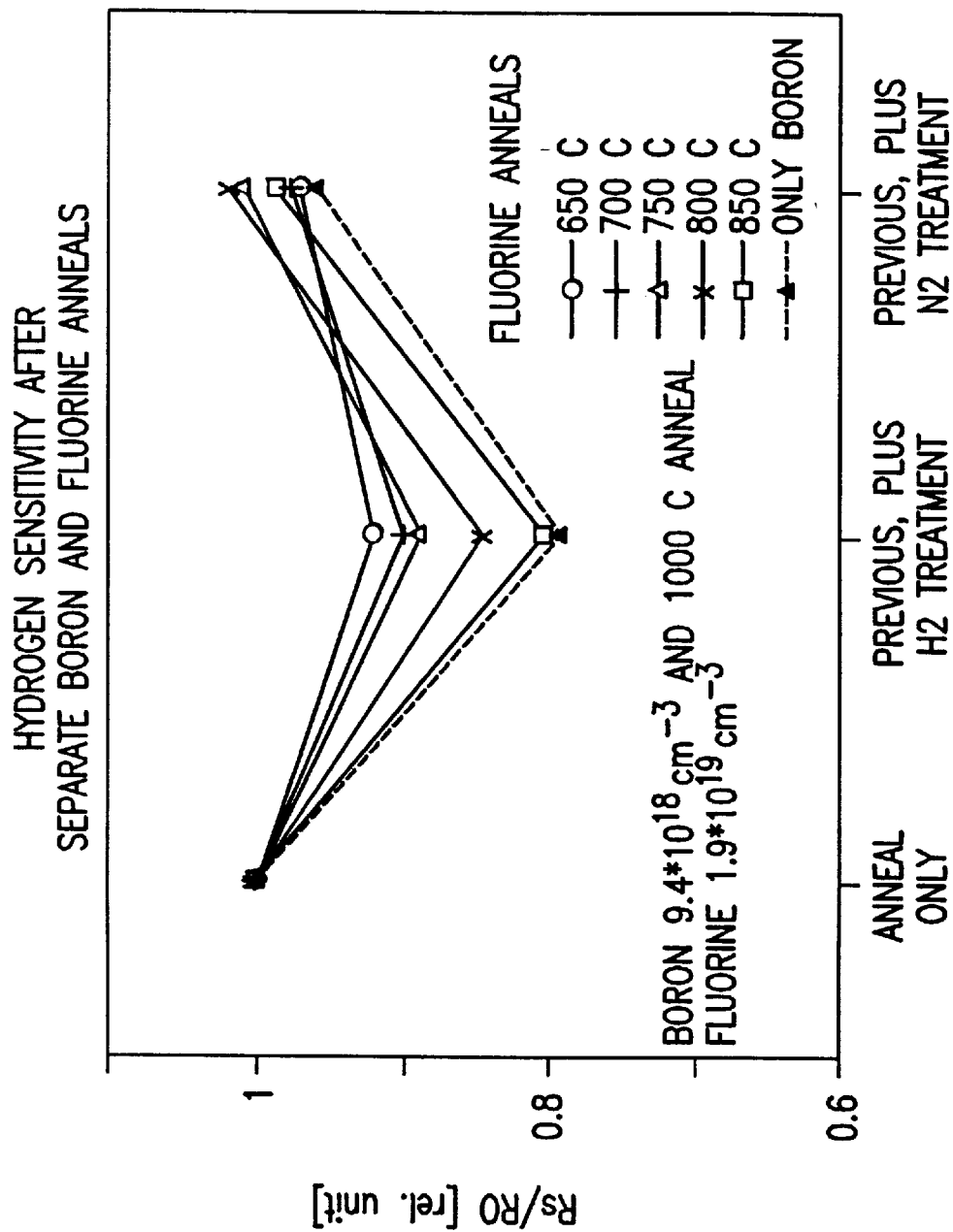
FIG. 7 is a graph illustrating how the resistance of polysilicon films having different amounts of added fluorine and subjected to two separate annealing steps depends on hydrogen diffused into the material.

The measured resistance values are shown in FIG. 7, which is a graph, along the vertical axis of which the relative resistance is plotted whereas along the horizontal axis different cases are plotted. At the leftmost places values are shown obtained without any treatment with hydrogen gas, in the middle places values for resistors subjected to a treatment with a mixture of hydrogen gas and nitrogen gas and at the rightmost places values obtained for resistors subjected to a treatment with first such a mixture of gases and finally comprising pure nitrogen gas. The resistors were produced according to examples 1 and 3. The largest change was found in films which had been produced according to example 1, i.e. without any fluorine addition. It is illustrated by the dotted line "Only boron" in FIG. 7. The other curves show the relative resistances for films which had been doped with fluorine to a concentration of $1.9 \cdot 10^{19}$ cm$^{-3}$ and which thereafter had been annealed separately at different temperatures according to example 3. It can be observed how the hydrogen sensitivity decreases continuously according to the annealing temperature. The lower limit for the annealing temperature is set due to other reasons, which are related to the requirement of a more or less perfect or substantially perfect crystal structure, as is illustrated in FIG. 4, see also the discussion hereinafter.

Figure 6:
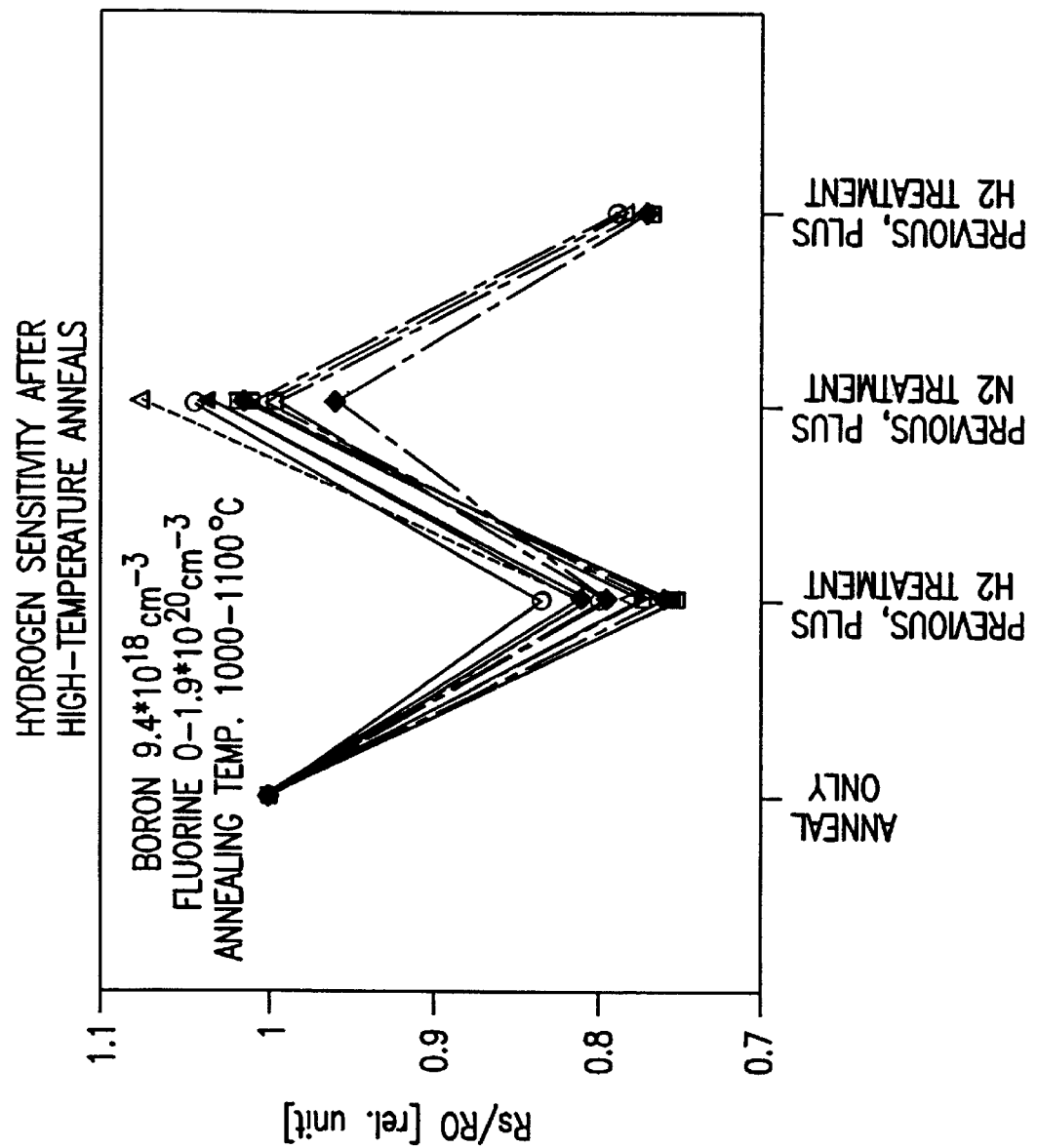
FIG. 6 is a graph illustrating how the resistance of polysilicon films having different amounts of added fluorine and subjected to a single annealing at the usually high processing temperatures depends on hydrogen diffused into the material.

In FIG. 6 relative resistance values are shown for a polysilicon film according to example 1 and for films according to example 2, which certainly have been doped with fluorine but where the annealing temperatures after the doping with fluorine have been high, 1000–1100° C. The films have been exposed to alternatingly treatments with a mixture of hydrogen gas and nitrogen gas and only nitrogen gas. Every curve in the figure represents a fluorine concentration in the interval of $(0–1.9) \cdot 10^{20}$ cm$^{-3}$. The hydrogen sensitivity of the material is in this case approximately the same for both low and very high fluorine concentrations. From the measurements and discussions presented hereinafter, it appears that this effect depends on the fact that the high temperatures used in the annealing process result in that the fluorine atoms is driven out of the grain boundaries.

Figure 4:
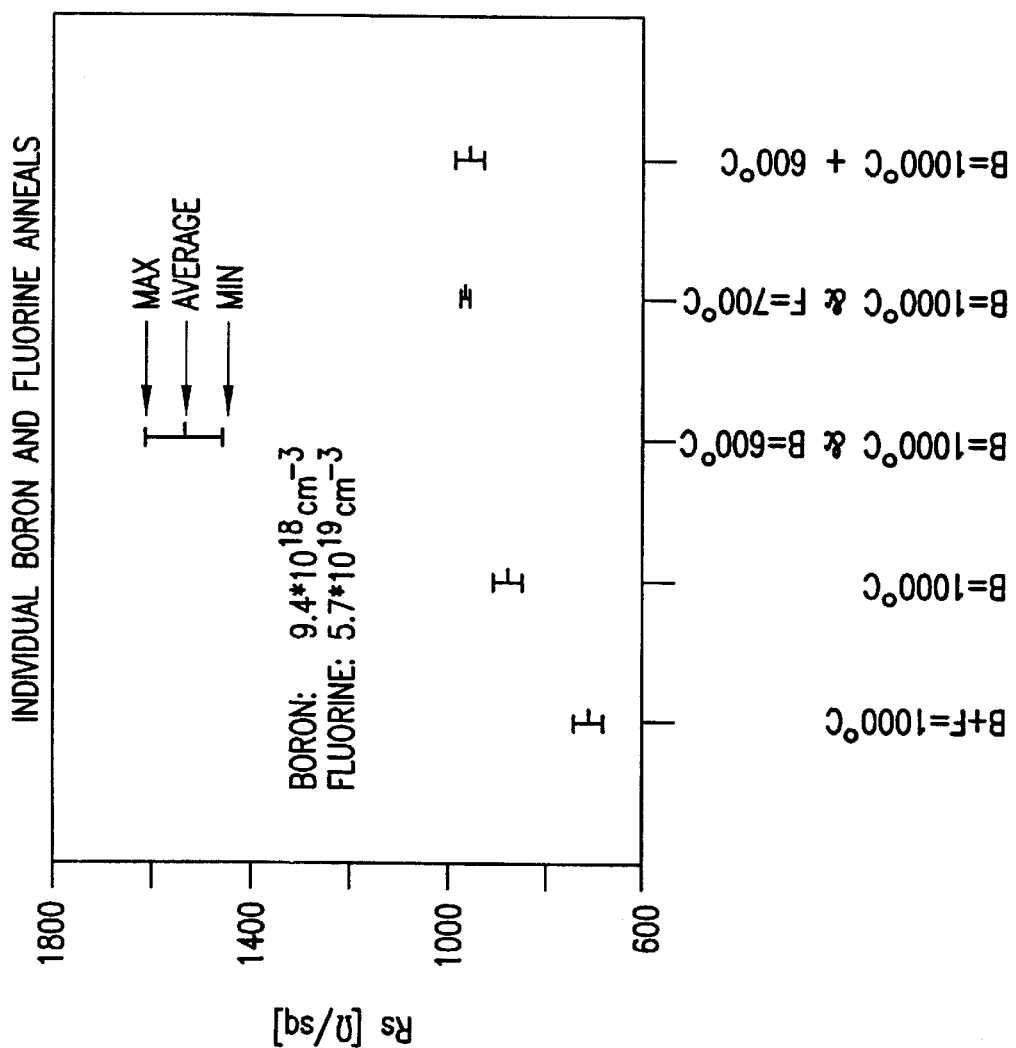
FIG. 4 is a graph illustrating how the resistance of polysilicon resistors depends on the addition of fluorine and on annealing temperatures.

FIG. 4 shows in the shape of a graph the influence of the annealing on the resistivity of the polysilicon resistors, the vertical axis showing the resistance of the produced rectangle or plate. Resistance values are plotted as vertical lines, the central points of which indicate the average value of the resistance values of the produced resistors and the lengths of which indicate the spread of the resistances. The upper and lower ends of the vertical lines thus indicate maximum and minimum values respectively. The resistors are produced according to the examples for varying annealing procedures, which have been performed as separate steps (indicated by "&") and combined steps (indicated by "+") respectively at temperatures according to the description at the lower side of the graph. Boron has been added in a concentration of $9.4 \cdot 10^{18}$ cm$^{-3}$.

The first point at the resistance of about 700 ohms has been obtained for first an implantation of boron, then an implantation of fluorine and thereupon an annealing at 1000° C. The second point, where the resistance is about 900 ohms, has been obtained for only an implantation of boron and thereupon an annealing at 1000° C. The third point having a resistance value at 5 somewhat above 1300 ohms has been obtained for first an implantation of boron, thereupon an annealing at 1000° C., thereupon an implantation of fluorine and finally an annealing at a low temperature, 600° C. The fourth point having a resistance of somewhat below 1000 ohms has been obtained in the same way as the third point except that the last annealing operation has been made at a higher temperature, at 700° C. The fifth point finally shows a resistance of lo somewhat below 1000 ohms and has been obtained for only an implantation of boron and thereupon first an annealing at 1000° C. and then an annealing at 700° C. The annealings have been made during time periods of 30 minutes as in the examples above.

Thus it appears from the third point, that separate annealing process steps directly after the implantations of boron and fluorine respectively comprising a low temperature of the annealing operation after the implantation of fluorine results in both a strong increase of the resistance and a large spread of the resistance values. It probably depends on damages to the structure of the polysilicon produced during the implantation. However, for a somewhat higher temperature of the annealing step a very good healing of the damages is obtained comprising a small variation of the resistance values, as appears from the point 4. A comparison of the points 4 and 5 also indicates that the addition of fluorine does not affect the resistance value, since at these two points identical annealing steps have been performed. A preferred interval for the annealing for healing damages after the implantation of fluorine could be between 650° C. and 800° C., in particular between 650° C. and 750° C.

Figure 5A:
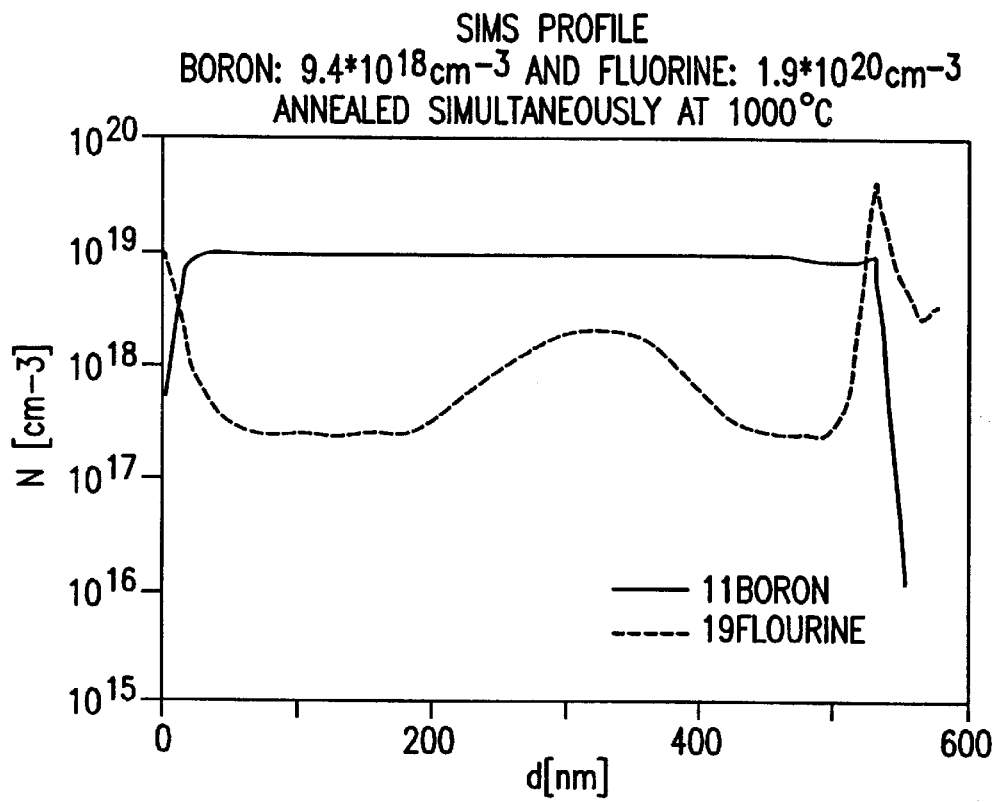
FIGS. 5a and 5b are graphs illustrating the distribution of boron atoms and fluorine atoms in a polysilicon film which has been produced by adding fluorine and by annealing operations made in different ways.
Figure 5B:
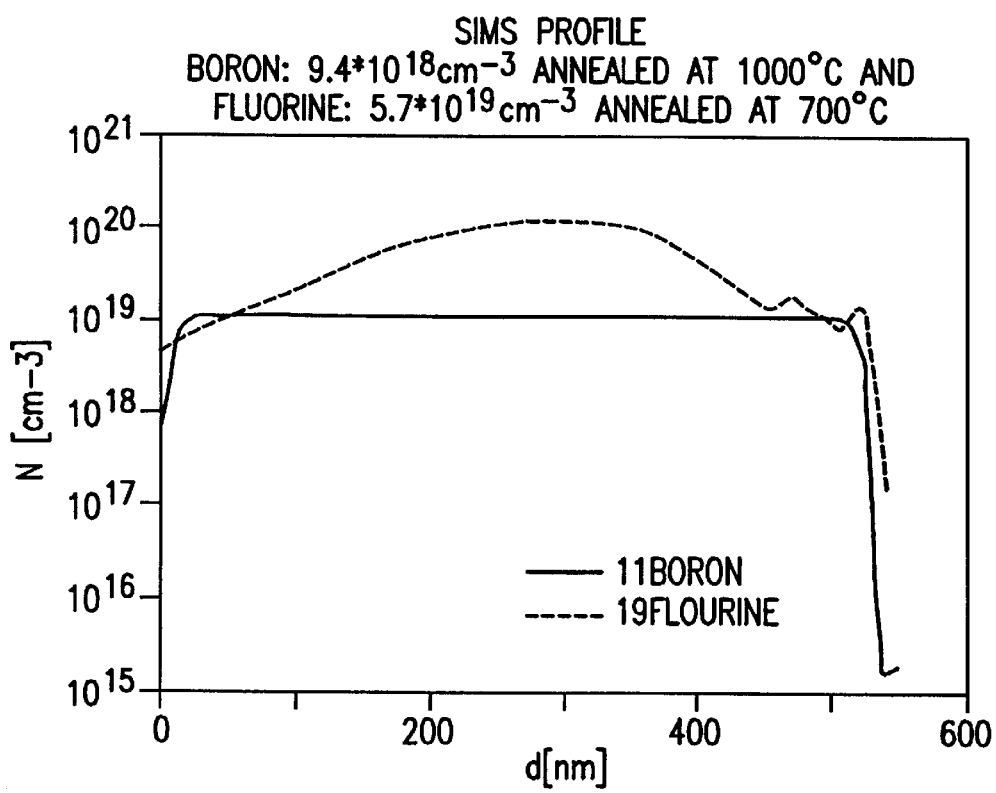

FIGS. 5a and 5b show at the curve drawn in a solid line the distribution of the concentration of boron atoms and at the curve drawn in a dotted line the concentration of fluorine atoms as a function of the distance d from a large surface of the resistor body, i.e. in the thickness direction, of a polysilicon film which has been produced substantially according to example 2 and example 3 respectively, for the special values for the implantation and the annealing of the fluorine atoms, as appears from the text of the graph. The curves have been obtained in a secondary ion mass spectrometric analysis (SIMS) of the film. A comparison between the figures indicates how according to FIG. 5a fluorine leaves the polysilicon film in the case where an annealing is made at 1000° C. after performing the implantations of both boron and fluorine and how according to FIG. 5b fluorine remains in the film in the case where an annealing is made at 1000° C. after implanting boron and before implanting fluorine and an annealing at 700° C. after implanting fluorine. In the first case the concentration of fluorine decreases from the high concentration of $1.9 \cdot 10^{20}$ cm$^{-3}$ to at most somewhat more than $1 \cdot 10^{18}$ cm$^{-3}$ after the annealing, where this value only is true in the centre of the resistor in the thickness direction thereof. Still lower concentrations are true at the upper and lower surfaces of the resistor. In the second case the high fluorine concentration in the central region of the material is maintained, as seen in the thickness direction. At the upper and lower surfaces some diffusion of fluorine atoms away from the material has taken place. The upper surface of the polysilicon film is in the figures assumed to be located at d=0 and the boundary surface between the polysilicon film and the oxide located below the film at d=530 nm.

The methods described above are not limited to the kind of dopants which has been indicated in the example above, i.e. the acceptor boron. The fact is that it appears that similar results are obtained for dopants of usually used kinds, such as all the acceptors boron, aluminium, gallium and indium, when they are used alone or in combination with each other, and for all donors phosphorous, arsenic and antimony respectively, when they are used alone or in combination with each other. Similarly one or more of the mentioned acceptors can be combined with one or more of the mentioned donors. Then it is not critical in which order the donor and the acceptor atoms are added to the material. Neither is it critical at which processing step the fluorine atoms are added to the polycrystalline material, as long as the subsequent process temperatures are maintained so low that the concentration of fluorine which is optimal for the stability is maintained in the finished resistor.

It is important that the minimum concentration of fluorine is maintained sufficiently high. The exact concentration, expressed as an average value over a large number of grains, depends among other things on the grain size of the polysilicon material. As a rule of thumb for all types of acceptors and donors it can be indicated that the concentration of fluorine should be at least equal to the concentration which would be obtained in a material having the corresponding resistivity in the case where it had been doped only using ions of boron difluoride. For the material produced according to example 3 it corresponds to for example a concentration of fluorine of about $2 \cdot 10^{19}$ cm$^{-3}$.

It is not required that the atoms of the various mentioned kinds are used in the shape of pure elements, but they can be included in compounds as long as they have the property that the molecules of these compounds are decomposed in such a way that the dopant atoms can enter the material during the process which is intended to add the dopant atoms to the polycrystalline silicon material.

The methods discussed above are neither associated only with thin polycrystalline films but comprise all types of resistors of polycrystalline silicon having an arbitrary resistance, the polycrystalline silicon of which has been doped with fluorine intending to achieve a long-time stability.

Also other methods of performing annealing processes than that indicated in the examples can be used. Thus the important high concentration of fluorine in the finished resistor can also be maintained in the case where the heating process is performed by using a rapid thermal annealing, or a so-called "Rapid Thermal Processing (RTP)".

The words polysilicon resistor are intended to include the use of polycrystalline silicon material for all applications, where the ability of the material to conduct electrical current is significantly influenced by the resistance of the material to the electric current.

Fluorine, donor and/or acceptor atoms can be added to the polycrystalline silicon material not only by means of ion implantation as in the described examples. The atoms can also be added to the material by diffusing dopants into the polycrystalline material. The latter method can be performed by heating the polycrystalline silicon material in one or several steps in atmospheres which contain one or a plurality of gases, in the molecules of which the desired atoms are included. Another method of diffusing dopants into the material is to coat the surface of the polycrystalline material with a material containing the desired atoms in such a concentration that these atoms can diffuse into the polycrystalline material in a simultaneous or subsequent driving-in or annealing process. In this context it is only important that the process temperatures are not allowed to be so high that the remaining fluorine concentration in the material exceeds the minimum level which is optimal for the long-time stability of the finished resistor.

What is claimed is:

1. A resistor comprising a resistor body of polycrystalline silicon and electric terminals arranged connected to the resistor body, the resistor body comprising a resistor portion between the electric terminals which gives the resistor its resistance, the polycrystalline silicon material in the resistor portion is doped with at least one dopant for achieving a desired resistance of the resistor, and the polycrystalline silicon material containing fluorine atoms for stabilizing the resistance, wherein the fluorine atoms in the polycrystalline silicon material in the resistor portion are provided in a concentration of at least $2.10^{19}$ cm$^{-3}$ such that otherwise unsaturated bonds at grain boundaries in the polycrystalline silicon material are blocked to such a high extent that the resistance of the resistor portion is substantially constant in time.

2. A resistor comprising a resistor body of polycrystalline silicon and electric terminals arranged connected to the resistor body, the resistor body comprising a resistor portion between the electric terminals which gives the resistor its resistance, the polycrystalline silicon material in the resistor portion is doped with at least one dopant for achieving a desired resistance of the resistor, and fluorine atoms are added to the polycrystalline silicon material for stabilizing the resistance, wherein the concentration of the fluorine atoms in the polycrystalline material in the resistor portion is at least $2.10^{19}$ cm$^{-3}$ and the polycrystalline silicon material is subjected to annealing at a first temperature prior to adding the fluorine toms, and to annealing at a second temperature of 800° C. or less after adding fluorine atoms to the body, wherein the second temperature is lower than the first temperature, and wherein after annealing at the second temperature, the fluorine atoms in the polycrystalline silicon material are provided at such a high concentration that otherwise unsaturated bonds at grain boundaries in the polycrystalline silicon material are blocked to such a high extent that the resistance of the resistor portion is substantially constant in time.

* * * * *